Figure 4:
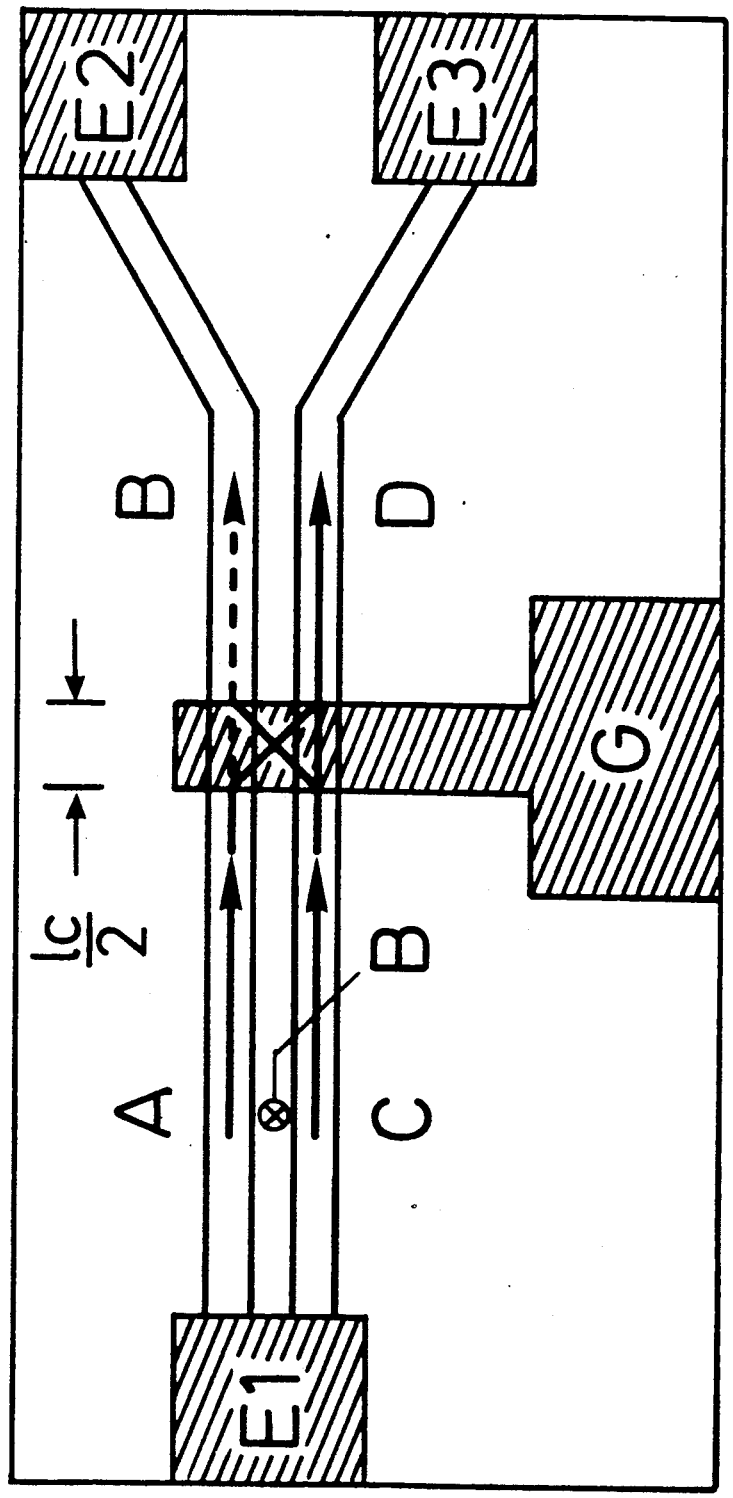

United States Patent [19]
Tsukada et al.

[11] Patent Number: 5,148,242
[45] Date of Patent: Sep. 15, 1992

[54] ELECTRON-WAVE COUPLED SEMICONDUCTOR SWITCHING DEVICE

[75] Inventors: Noriaki Tsukada; Klaus Ploog, both of Stuttgart, Fed. Rep. of Germany

[73] Assignee: Max Planck Gesellschaft zur Foerderung der Wissenschaften e.V., Goettingen, Fed. Rep. of Germany

[21] Appl. No.: 645,064

[22] Filed: Jan. 22, 1991

[30] Foreign Application Priority Data

Jan. 23, 1990 [EP] European Pat. Off. ......... 90101333.4

[51] Int. Cl.$^5$ ........................................... H01L 29/161
[52] U.S. Cl. ........................................ 357/16; 357/4; 357/68; 359/248; 359/254; 359/248; 333/248; 333/239
[58] Field of Search ............ 357/16, 4, 22 A, 22 MD, 357/68; 350/96.13; 333/157, 113, 208, 138, 108, 103, 248, 239; 385/8, 9, 32, 50, 47, 40, 41; 359/254, 248

[56] References Cited

U.S. PATENT DOCUMENTS

| | | | |
|---|---|---|---|
| 4,799,091 | 1/1991 | Reed | 357/16 X |
| 4,989,052 | 1/1991 | Okada et al. | 357/16 X |

FOREIGN PATENT DOCUMENTS

| | | |
|---|---|---|
| 0212295 | 3/1987 | European Pat. Off. . |
| 0324999 | 7/1989 | European Pat. Off. . |
| 0351320 | 1/1990 | European Pat. Off. . |
| 3726842 | 2/1988 | Fed. Rep. of Germany . |

OTHER PUBLICATIONS

Ishikawa et al, "Monolithic Integration Of An Embedded Stripe Laser And A Strip-Waveguide Modulator," The Transactions Of The IECE Of Japan, vol. E 61, No. 3, Mar. 1978, pp. 104–107.
Quantum Transport in an Electron-Wave Guide, Physical Review Letters, vol. 59, No. 6, Aug. 10, 1987, pp. 732–735, G. Timp, et al.
Quantized Conductance of Point Contacts in a Two-Dimensional Electron Gas, Physical Review Letters, vol. 60, No. 9, Feb. 29, 1988, pp. 848–850, B. J. van Wees, et al.
Electron Gas in Semiconductor Multiple Quantum Wires: Spatially Indirect Optical Transitions, Physical Review Letters, vol. 63, No. 15, Oct. 9, 1989, pp. 1641–1644 J. S. Weiner, et al.
Narrow conducting channels defined by helium ion beam damage, Appl. Phys. Lett., vol. 53, No. 20, Nov. 14, 1988, pp. 1964–1966, T. L. Cheeks, et al.
Interface of p-type $Hg_{1-x}Cd_xTe$ passivated with native sulfides, J. Appl. Phys., vol. 58, No. 1, Jul. 1, 1985, pp. 366–373, Y. Nemirovsky, et al.

(List continued on next page.)

Primary Examiner—William Mintel
Attorney, Agent, or Firm—Townsend & Townsend

[57] ABSTRACT

An electron-wave coupled semiconductor device, in particular a semiconductor switching device, comprises a first layer of semiconducting material having a first bandgap, and a second layer of material formed on said first semiconducting layer and having a second bandgap greater than the first said bandgap. First and second electron waveguides are formed alongside but spaced apart from each other in the first semiconductor layer adjacent the boundary between this layer and said second layer. A gate region extends over said second layer transverse to and over said electron waveguides. First contact means provides input connections to said first and second electron waveguides on one side of said gate region and further contact means provides separate output connections from said first and second electron waveguides on the opposite side of the gate region from said first contact means. The dimension of the electron waveguides under said gate region, both along and transverse to said electron waveguides, and also the dimension between said electron waveguides are smaller than the elastic mean free path for electrons at the operating temperature of the device. A signal applied to the gate region can be used to switch a signal applied to said input contact means selectively to a selected one of the output connections.

29 Claims, 9 Drawing Sheets

OTHER PUBLICATIONS

Some Design Considerations for Multi-Quantum-Well Lasers, Japanese Journal of Applied Physics, vol. 23, No. 8, Aug., 1984, pp. 970–974, Herbert Kroemer, et al.

Modulation-Doped GaAs/(Al,Ga)As Heterojunction Field-Effect Transistors: MODFETs, Proceedings of the IEEE, vol. 74, No. 6, Jun., 1986, pp. 773–810, Timothy J. Drummond, et al.

Absence of backscattering in the quantum Hall effect in multiprobe conductors, Physical Review B, vol. 38, No. 14, Nov. 15, 1988, pp. 9375–9389, M. Buttiker.

Effect of impurities on the quantized conductance of narrow channels, Physical Review B, vol. 40, No. 9, Sep. 15, 1989, pp. 5941–5949, C. S. Chu et al.

Effects of interference on couplings in three optical waveguides, J. Appl., Phys. vol. 51, No. 5, May, 1980, pp. 2450–2454, Noriaki Tsukada, et al.

High-efficiency coupling between phase-mismatched optical waveguides, J. Appl. Phys., vol. 50, No. 7, Jul., 1979, pp. 4611–4615, Noriaki Tsukada, et al.

Proposed structure for large quantum interference effects, Appl. Phys. Lett., vol. 48, No. 7, Feb. 17, 1986, pp. 487–489, S. Datta, et al.

Novel Interference Effects between Parallel Quantum Wells, Physical Review Letters, vol. 55, No. 21, Nov. 18, 1985, pp. 2344–2347, S. Datta, et al.

Four-Terminal Phase-Coherent Conductance, Physical Review Letters, vol. 57, No. 14, Oct. 6, 1986, pp. 1761–1764, M. Buttiker.

Hot Ballistic Transport and Phonon Emission in a Two-Dimensional Electron Gas, Physical Review Letters, vol. 63, No. 9, Aug. 28, 1989, pp. 992–995, U. Sivan, et al.

Quenching of the Hall Effect in a One-Dimensional Wire, Physical Review Letters, vol. 59, No. 26, Dec. 28, 1987, pp. 3011–3014, M. L. Roukes, et al.

Quantized Multichannel magnetrotransport through a Barrier in Two Dimensions, Physical Review Letters, vol. 61, No. 24, Dec. 12, 1988, pp. 2797–2800, R. J. Haug, et al.

Theory of Quantum Conduction through a Constriction, Physical Review Letters, vol. 62, No. 3, Jan. 16, 1989, pp. 300–303, Aaron Szafer, et al.

Landau-Band Conductivity in a Two-Dimensional Electron System Modulated by an Artificial One-Dimensional Superlattice Potential, Physical Review Letters, vol. 62, No. 10, Mar. 6, 1989, pp. 1177–1180, R. W. Winkler, et al.

Fabrication of Ballistic Quantum Wires and their Transport Properties, Japanese Journal Of Applied Physics, vol. 28, No. 10, part 1, Oct., 1989, pp. 2188–2192, Tokyo, JP; Y. Takagaki, et al.

Coupled Channel Interference Device, IBM Technical Disclosure Bulletin, vol. 29, No. 3, Aug., 1986, pp. 1370–1371, New York, US.

Proposed structure for large quantum interference effects, Applied Physics Letters, vol. 48, No. 7, Feb. 1986, pp. 487–489, Woodbury, New York, US; S. Datta et al.

Narrow conducting channels defined by helium ion beam damage, Applied Physics Letters, vol. 53, No. 20, Nov. 14, 1988, pp. 1964–1966, New York, NY, US; T. L. Cheeks et al.

Quantum mechanical effects in very short and very narrow channel MOSFETs, International Electron Devices Meeting, Technical Digest, Washington, DC, Dec. 1–4, 1985, pp. 558–560, IEEE, New York, US: D. A. Antoniadis et al.

Fabrication of Quantum Wires by Ga Focused-Ion-Beam Implantation and Their Transport Properties, Japanese Journal of Applied Physics, vol. 29, No. 1, Jan. 1990, pp. 48–52, Syunji Nakata, et al.

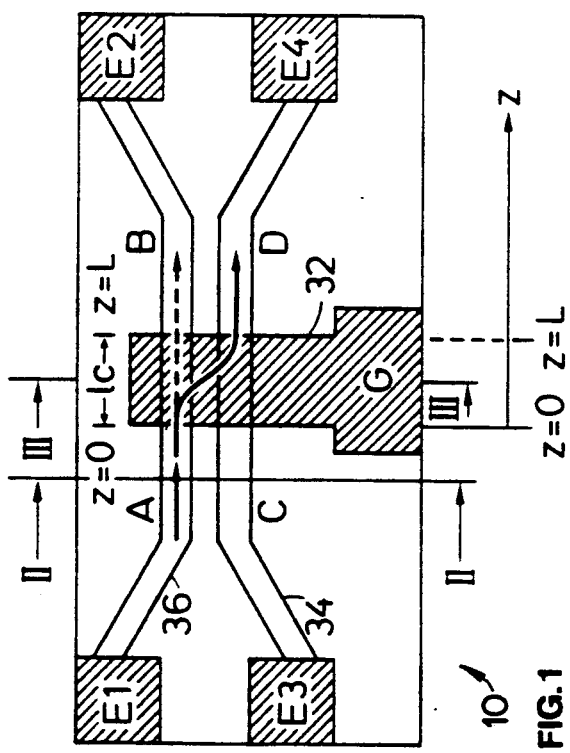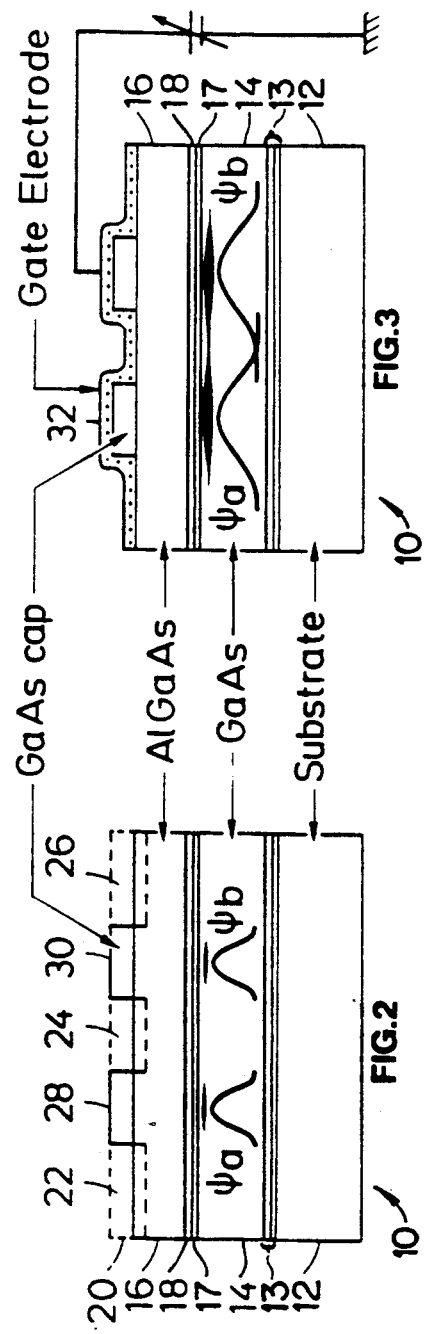

FIG.10A
Exlusive OR(EOR)-GATE
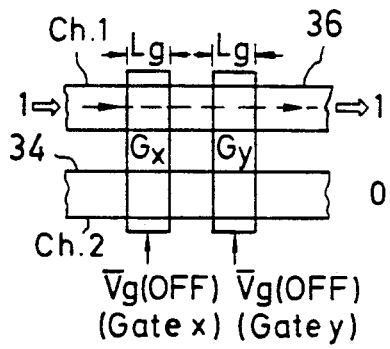
FIG.10B
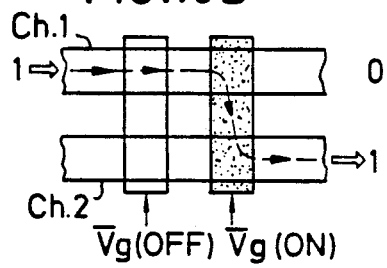
FIG.10C
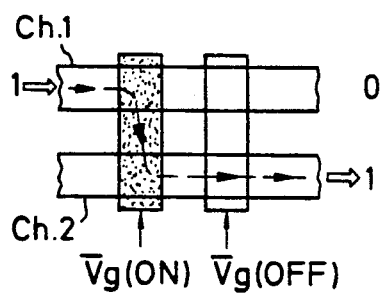
FIG.10D
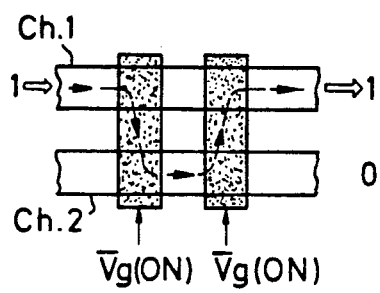
FIG.10E
Logic Table
|   | Gate Voltage | | Output | |
|---|---|---|---|---|
|   | $\bar{V}x$ | $\bar{V}y$ | Channel1 | Channel2 |
| Ⓐ | Vg(OFF) | Vg(OFF) | 1 | 0 |
| Ⓑ | Vg(OFF) | Vg(ON) | 0 | 1 |
| Ⓒ | Vg(ON) | Vg(OFF) | 0 | 1 |
| Ⓓ | Vg(ON) | Vg(ON) | 1 | 0 |
FIG.10F
|   | Vx | Vy | Ch.1 | Ch.2 |
|---|---|---|---|---|
| Ⓐ | 0 | 0 | 1 | 0 |
| Ⓑ | 0 | 1 | 0 | 1 |
| Ⓒ | 1 | 0 | 0 | 1 |
| Ⓓ | 1 | 1 | 1 | 0 |
|   | x | y |   | x⊕y ↑ EOR |

FIG.11 A
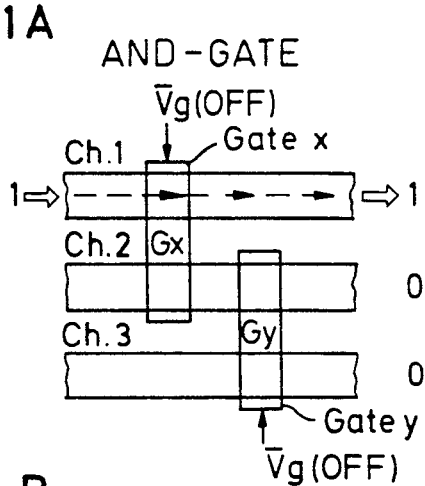
FIG.11.B
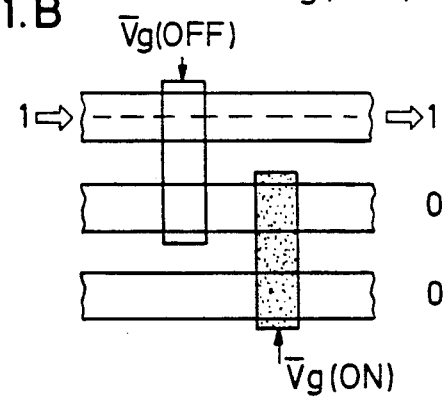
FIG.11 C
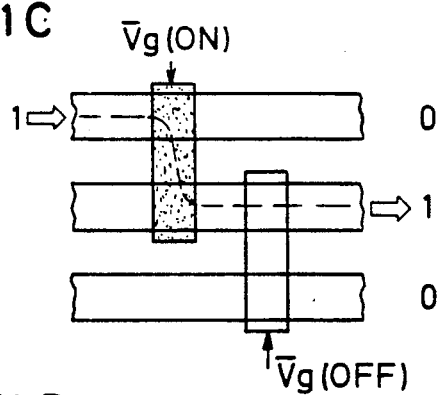
FIG.11 D
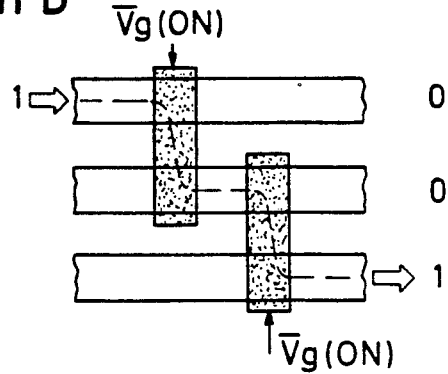
FIG.11 E
|   | $\overline{V}x$ | $\overline{V}y$ | Ch.1 | Ch.2 | Ch.3 |
|---|---|---|---|---|---|
| Ⓐ | 0 | 0 | 1 | 0 | 0 |
| Ⓑ | 0 | 1 | 1 | 0 | 0 |
| Ⓒ | 1 | 0 | 0 | 1 | 0 |
| Ⓓ | 1 | 1 | 0 | 0 | 1 |
|   | x | y | $\overline{x}$ |   | x·y |
|   |   |   | ⇑ |   | ⇑ |
|   |   |   | NOT(x) |   | AND |

FIG. 12 A
NOR (Not OR)-Gate
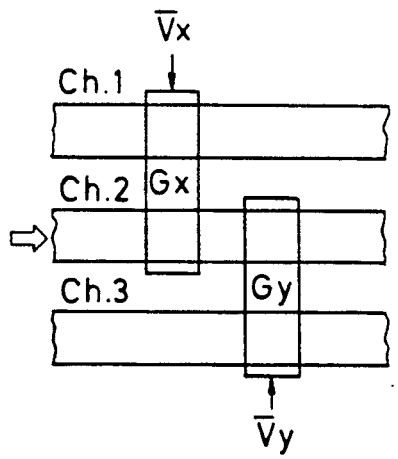
FIG. 12 B
| $\overline{V}x$ | $\overline{V}y$ | Ch.1 | Ch.2 | Ch.3 |
|---|---|---|---|---|
| 0 | 0 | 0 | 1 | 0 |
| 0 | 1 | 1 | 0 | 0 |
| 1 | 0 | 0 | 0 | 1 |
| 1 | 1 | 1 | 0 | 0 |
| x | y |  | $\overline{x+y}$ |  |
⇧ NOR
FIG. 13 A
NOT-GATE (INVERTER)
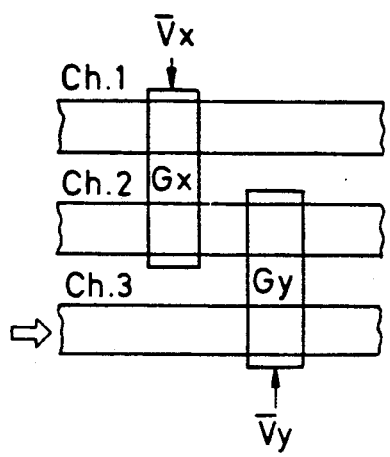
FIG. 13 B
| Vx | Vy | Ch.1 | Ch.2 | Ch.3 |
|---|---|---|---|---|
| 0 | 0 | 0 | 0 | 1 |
| 0 | 1 | 0 | 1 | 0 |
| 1 | 0 | 0 | 0 | 1 |
| 1 | 1 | 0 | 1 | 0 |
| x | y |  |  | $\overline{y}$ |
⇧ NOT(y)

OR-GATE

| $\overline{V}x$ | $\overline{V}y$ | Ch.1 | Ch.2 | Ch.3 | Ch.1+Ch.3 |
|---|---|---|---|---|---|
| 0 | 0 | 0 | 1 | 0 | 0 |
| 0 | 1 | 1 | 0 | 0 | 1 |
| 1 | 0 | 0 | 0 | 1 | 1 |
| 1 | 1 | 1 | 0 | 0 | 1 |
| x | y |  | $\overline{x+y}$ |  | x+y |
|  |  |  | NOR |  | OR |

ELECTRON-WAVE COUPLED SEMICONDUCTOR SWITCHING DEVICE

The present invention relates to an electron-wave coupled semiconductor device and has particular reference to a semiconductor switching device. More particularly the novel device proposed herein is suitable for the fast switching of an electrical signal, in particular for the switching of digital signals in a computer, it could also be used for the switching of analog signals. Furthermore, the device could be used as a signal or power divider. One of the objects of the present invention is to propose a switch device or signal or power divider based on an electron-wave coupler which is very fast in operation, is suitable for high integration and which can also preferably be used at room temperature.

So far as is known the prior art does not disclose electron-wave coupled switching devices so that the present invention relates to a new class of devices.

In recent years there has been a great deal of interest in the physics of electronic transport in mesoscopic systems due to advances in microfabrication technology and material growth techniques. In this respect attention is drawn to the following prior art papers:

1. G. Timp, A. M. Chang, P. Mankiewich, R. Behringer, J. E. Cunningham, T. Y. Chang, and R. E. Howaed, Phys. Rev. Lett. 59, 732 (1987).
2. B. J. van Wees, H. van Houten, C. W. J. Beenakker, J. G. Williamson, L. P. Kouvenhoven, D. van der Marel, and C. T. Foxon, Phys. Rev. Lett. 60, 848 (1988).
3. U. Sivan, M. Heiblum, and C. P. Umbach, Phys. Rev. Lett. 62, 992 (1989).
4. A. Szafer and A. D. Stone, Phys. Rev. Lett. 62, 300 (1989).

The dimensions of mesoscopic system are smaller than the inelastic mean-free path of electrons at sufficiently low temperatures, and as a consequence the electron wave functions can extend coherently over the entire system. When the dimensions are smaller than the elastic mean-free path, the electron transport is in the ballistic regime and there is no scattering of any kind. In high mobility GaAs/AlGaAs systems, elastic means-free paths as long as 3 to 8 $\mu$m have recently been reported in several papers, for example:

5. M. L. Roukes, A. Scherer, S. J. Allen, Jr., H. G. Graighead, R. M. Ruthen, E. D. Beebe, and J. P. Habrison, Phys. Rev. Lett. 59, 3011 (1987).
6. R. J. Haug, A. H. MacDonald, P. Streda, and K. von Klitzing, Phys. Rev. Lett. 61, 2797 (1988).
7. R. W. Winkler, J. P. Kotthaus, and K. Ploog, Phys. Rev. Lett. 62, 1177 (1989).

The present invention is concerned with a novel device structure which utilizes the electron wave coupling between two parallel electron waveguides.

More particularly the present invention is concerned with an electron wave coupled semiconductor device, in particular, a semiconductor switching device, comprising a first layer of semiconducting material having a first bandgap, a second layer of material formed on said first semiconducting layer and having a second bandgap greater than the first bandgap, first and second electron waveguides formed alongside but spaced apart from each other in the first semiconducting layer adjacent the boundary between this layer and said second layer, a gate region extending over said second layer transverse to and over said electron waveguides, first contact means providing input connections to said first and second electron waveguides on one side of said gate region and further contact means providing separate output connections from said first and second electron waveguides on the opposite side of the gate region from said first contact means, wherein the dimension of the electron waveguides under said gate region, both along and transverse to said electron waveguides and also the dimension between said electron waveguides is smaller than the elastic mean free path for electrons at the operating temperature of the device.

The basic physics underlying the invention is as follows:

If an electron is initially in one of the two electron waveguides its wave function will be a linear combination of the symmetric state (energy $E_s$) and antisymmetric state (energy $E_a$) with equal amplitudes. Each state is associated with a time-dependent pure phase factor of the form exponential $(-iE_{s,a}t/\hbar)$. Because the two states have slightly different energies $\Delta E = E_a - E_s$, their phase factors advance at slightly different rates, and the resultant linear combination wave function corresponds to an electron that oscillates back and forth between the two electron waveguides with a frequency $f = \Delta E/h$. If at time $t=0$ the electron was in one of the two electron waveguides, then it will be found in the other electron waveguide after one half period of this oscillation, that is, after the time $t_T = h/2\Delta E$, which may be considered as the time required for an electron to transfer to the other electron waveguide.

The physics of this process will be described in further detail later with reference to the accompanying drawings.

It is particularly advantageous for the electron waveguides to be channels formed by laterally constricted regions of a two-dimensional electron gas, said restricted regions representing a quasi one-dimensional electron gas.

It is particularly preferred for the subband energy levels of the isolated electron waveguides to have the same value since this ensures the full transfer of electrons between the two waveguides. If this condition is not fulfilled then the transfer is only partial, which can however have certain practical applications, for example the dividing of a signal between two channels.

In practice it is expedient to provide means for varying the voltage applied in operation to the gate region, since this enables the switching process to be finely tuned, the efficiency of switching being a function of both the length of the electron waveguides under the gate region and of the voltage applied to the gate region. Clearly the length of the electron waveguides under the gate region is set during manufacture, whereas the voltage applied to the gate region can be readily varied in use.

Since full transfer of the signal applied to one electron waveguide from that waveguide to the other is only expected with a particular gate voltage it is also to be expected that a partial transfer of the signal can be achieved with a gate voltage which differs from this particular gate voltage. i.e., the device can be operated as a signal or power divider.

A typical switching device will be a four port switching device with two inlet ports and two outlet ports. In practice this means that the first contact means will comprise first and second contacts to said first and second electron waveguides with these first and second contacts defining first and second inlet ports. The further contact means, which again consists of separate contacts provides separate output connections or output ports from the first and second electron waveguides.

It is however also possible to realize the first contact means as a common contact to the first and second electron waveguides and to provide field generating means for generating a magnetic field perpendicular to a plane containing said first and second waveguides in the region between said common contact and said gate region. A device of this kind thus makes use of both the present invention and also of the Aharonov-Bohm effect. This arrangement allows a signal supplied to the common contact to be switched as desired to either of the output ports, i.e. to either of the two separate contacts of the further contact means. A particular advantage lies in the fact that the coupling length, i.e. the length of the electron waveguides under the gate region, is reduced by one half in comparison to the four port device, which results in a corresponding increase in the switching speed.

In either case, i.e. respective of whether one is dealing with a four port or three port device, the device itself is conveniently realized as a III-V heterostructure which is characterized in that the first semiconductor layer comprises the material having the smaller band gap and in that the second layer comprises the material having the larger band gap.

In a device of this kind a two or quasi one-dimensional electron gas forming said electron waveguides is preferably formed in said first semiconductor layer adjacent said second layer by modulation doping of said second layer. The modulation doping technique is for example described in European patent application No. 87 116 451.3 or its corresponding U.S. Pat. No. 4,878,095.

A particular realization of the device of the present invention is based on an AlGaAs/GaAs heterostructure which is characterized in that said first semiconducting layer comprises an intrinsic gallium arsenide layer having a thickness in the range of $1\mu$ to $10\mu$, in particular of $2\mu$, grown on a GaAs substrate, preferably with buffer layers therebetween. These buffer layers comprise in known manner several periods of a superlattice structure which function to prevent impurities present in the substrate from migrating into the first semiconductor layer. In this embodiment the second layer comprises an undoped $Al_{0.3}Ga_{0.7}As$ layer having a thickness in the range from 100 to 1000 Å and typically 200 Å; and a modulation doping layer in the form of n-doped $Al_{0.3}Ga_{0.7}As$ is provided in said second layer. The dopant is typically silicon with a concentration in the range 1 to $3\times10^{18}/cm^3$, and the modulation doping layer typically has a thickness from one monolayer up to ca. 500 Å and is spaced from the boundary of said GaAs layer by a distance (undoped $Al_{0.3}Ga_{0.7}As$ spacer) in the range from 10 to 300 Å.

In a device of this kind, or indeed in any device in accordance with the invention it is necessary to provide some form of lateral confinement for the electron waveguides, i.e. lateral boundaries for the same. This can conveniently be done by converting the regions of the device on either side of the electron waveguides and inbetween the electron waveguides (but not beneath the gate electrode) to insulating material by ion implantation or ion bombardment.

If the bombardment is carried out with an ion beam of extended cross-section it is convenient to grow a cap layer on the second layer and to etch this cap layer away to form cap regions having substantially the same size and shape in plan view as the desired electron waveguides. In a GaAs/AlGaAs heterostructure the cap layer would typically be formed by a non-doped gallium arsenide layer having a thickness of 100 to 300 Å. After photoetching the gate region is then formed over the second layer and over the cap regions, and indeed is preferably a Schottky gate, for example of gold. The structure is then subjected to ion bombardment to define the electron waveguides with the energies of the ions being selected so that they affect regions to the sides of and between the electron waveguides, but not the regions containing the electron waveguides or under the gate region due to the increased thickness and/or nature of the material above said electron waveguides in said cap regions.

The first contact means and the further contact means would typically comprise metallic contacts, for example gold or germanium diffused into the device, for example at 450° C. for a period of 80 sec. in a gaseous environment of 80% $N_2$. and 20% $H_2$ at normal pressure, although helium or argon or other inert gases could also be used if desired. The contact means would normally be formed after formation of the cap regions and before deposition of the gate electrode.

The boundaries of the electron waveguides can also be "drawn" on the chip using a sharply focussed ion beam source which converts the material in its path to fully insulating material. Irrespective of whether the ion beam bombardment is carried out with a focussed ion beam or an ion beam of extended cross-section, it will essentially define an H-shaped insulating structure in plan view with the vertical limbs of the H corresponding to the electron waveguides and with the cross-bar corresponding to the region beneath the gate electrode.

The electron waveguides provided by the invention would typically have a thickness up to 30 Å, a width in the range 2 to $3\times10^3$ Å. They are typically separated from each other by a distance of 2 to $3\times10^3$ Å. These dimensions apply to a relatively low operating temperature, for example an operating temperature at the temperature of liquid nitrogen. As the operating temperature of the device increases the dimensions have to reduce in size and one is then beginning to reach the limits of size which can be produced by current lithographic techniques. However, it is anticipated that advances in lithographic techniques will allow the invention to be realized in devices capable of operating at room temperature.

The gate region has a width in the length direction of the electron waveguides of the order of magnitude of $0.3\mu$ and a length transverse to the electron waveguides of the order of magnitude of $1\mu$. The width of the gate region of $0.3\mu$ corresponds to the effective coupling length of the electron waveguides.

An alternative switching device in accordance with the present invention is based on silicon and in this case the first layer comprises a p-doped silicon layer whereas the second comprises an $SiO_2$ layer, with said electron waveguides being formed by a two dimensional electron gas in said p-doped silicon layer adjacent the boundary between said p-doped silicon layer and said $SiO_2$ layer. In this case the gate region comprises first, second and third gate electrodes, typically of aluminium or gold. In operation the voltages applied to the first and second gate electrodes are selected to separately confine the electron waves and the voltage applied to the second gate electrode, which is disposed between the first and third gate electrodes is varied to induce coupling between the electron waves and thus produce switching. The width of the second gate electrode in the length direction of the electron wave guides corresponds to the coupling length $l_c$ and the separation between the first and second gate electrodes, and between the second and third gate electrode is relatively short, for example less than 0.1 μm.

With this embodiment the cap regions are formed on the $SiO_2$ layer and typically consist of metal. The cap regions extend up to but do not touch the contacts to the electron waveguides, i.e. are spaced from the contacts by a small distance. In this embodiment the cap regions are used to concentrate electrons in the region beneath them in the first layer adjacent the boundary between the first and second layers and thus their shape and size define the shape and size of the electron waveguides in plan view. For the formation of these cap regions a full metal layer can be deposited and selectively etched away. After the cap regions have been formed a further $SiO_2$ layer is grown on top of the exposed portions of the first said $SiO_2$ layer and on top of the cap regions and the gate electrodes are then applied on top of the overlying $SiO_2$ layer. In this case the electron wave functions are controlled by the gate voltage. The voltage applied to the first and third gates should be sufficiently large to confine the electron waves under the cap layers. On the other hand the voltage applied to the second gate must be small so as to permit overlap of the electron waves of the two waveguides.

As previously mentioned, a device in accordance with the present invention is well suited for high integration.

For example a plurality of electron waveguides can be provided and can be arranged parallel to one another and spaced apart in the first semiconducting layer adjacent the boundary with said second layer, with a plurality of gate regions being provided, each gate region extending over two adjacent electron waveguides. Clearly only the required input and output contacts must be provided to each electron waveguide.

In addition, a series arrangement of devices in accordance with the present invention is entirely feasible.

Figure 5:
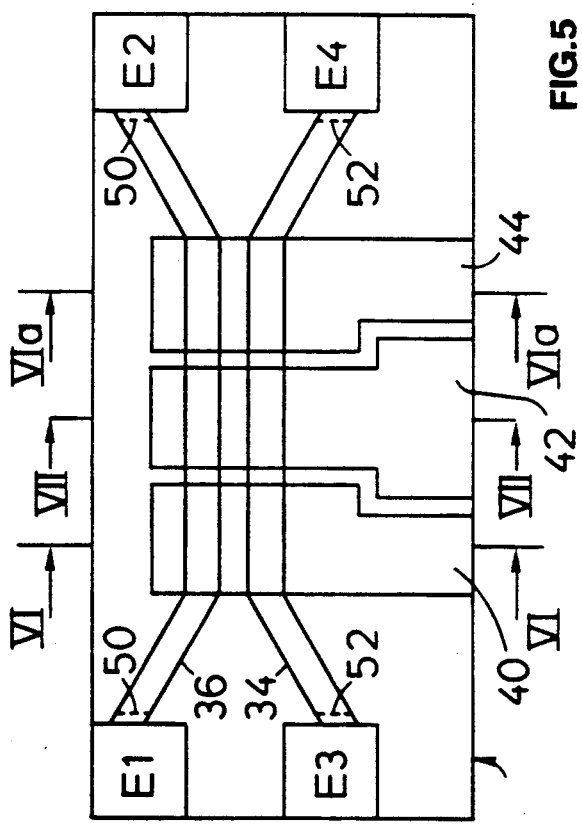
Figure 7:
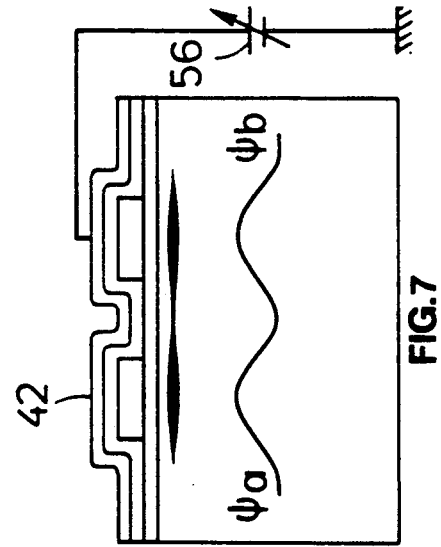
Figure 6:
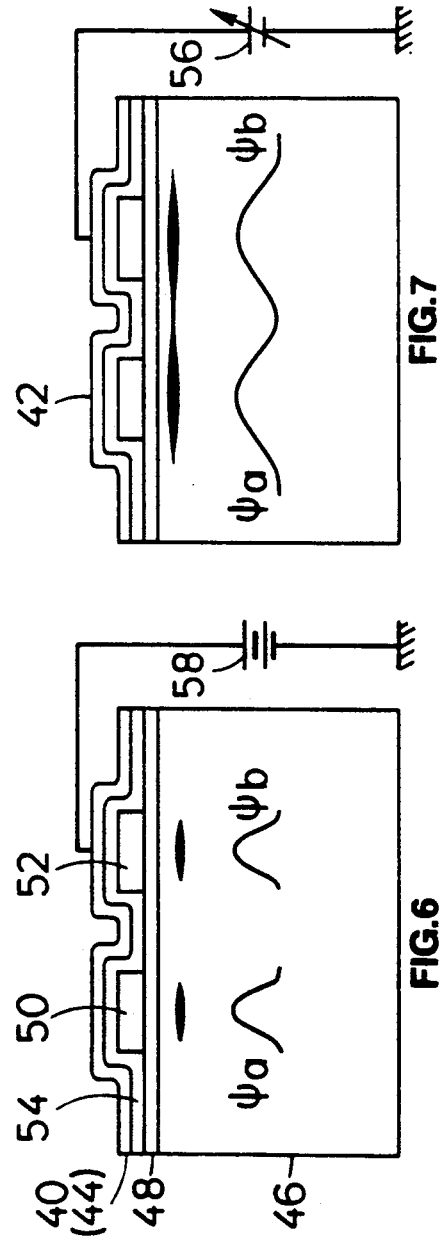
Figure 8:
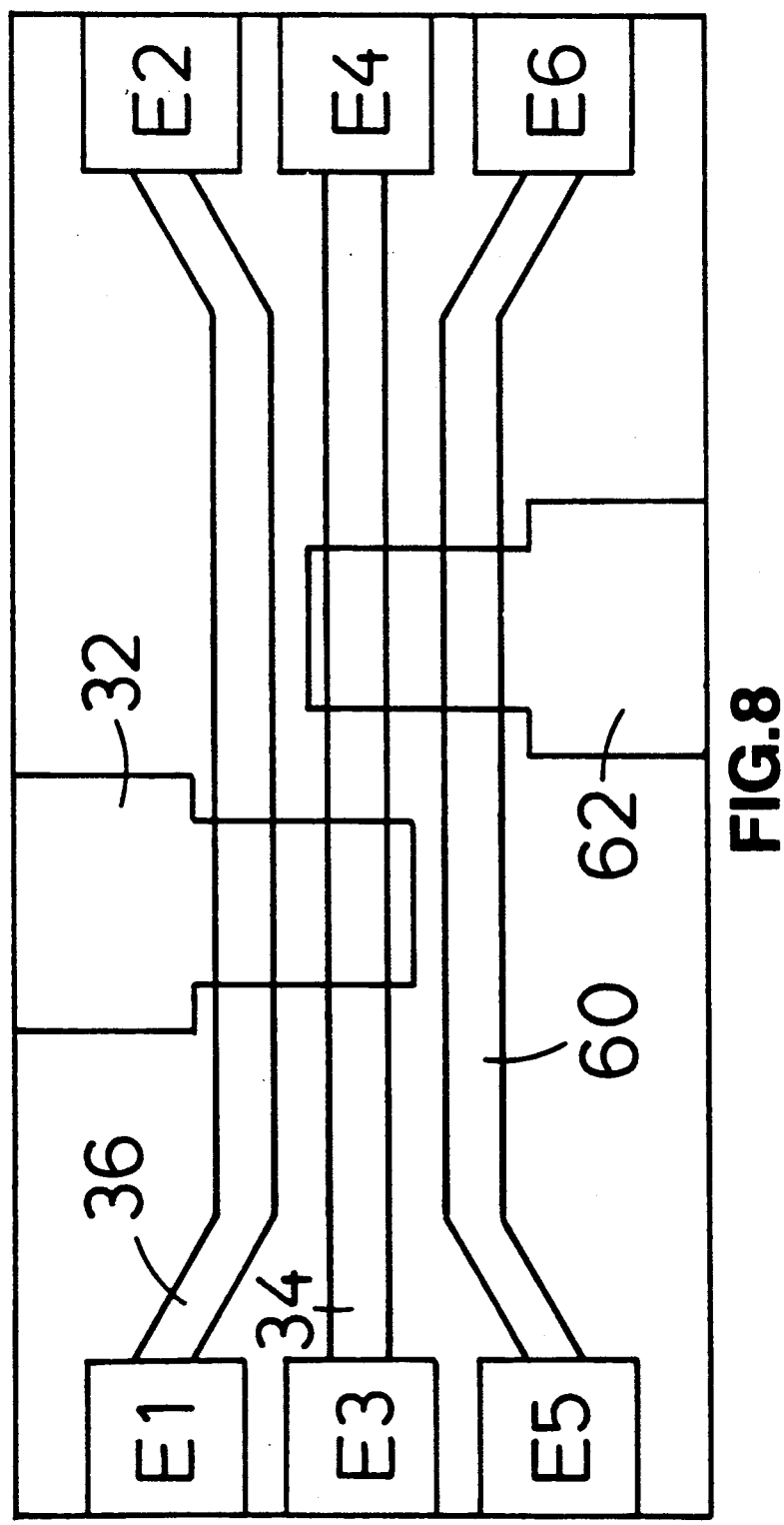
Figure 9:
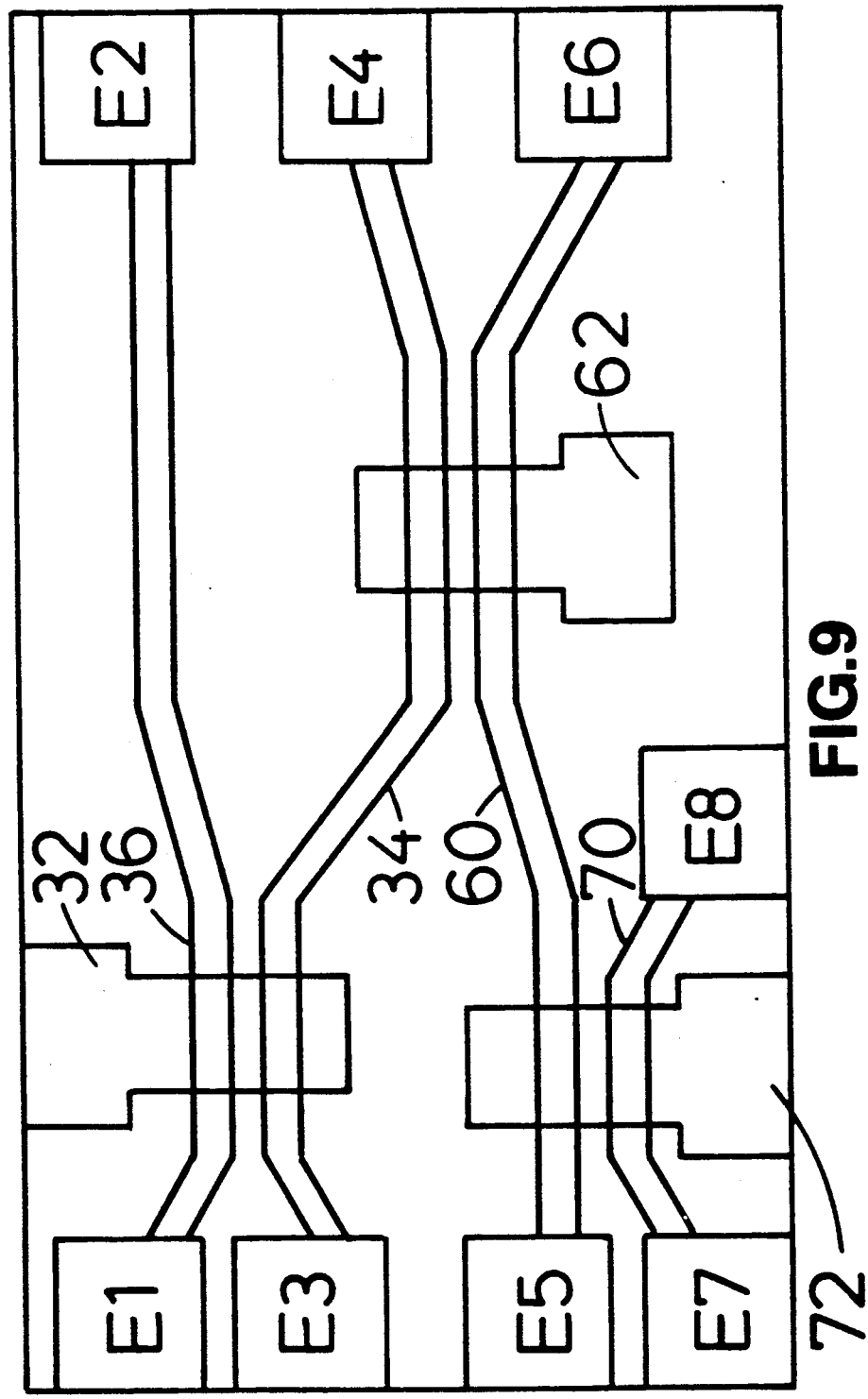
Figures 14A, 14B:
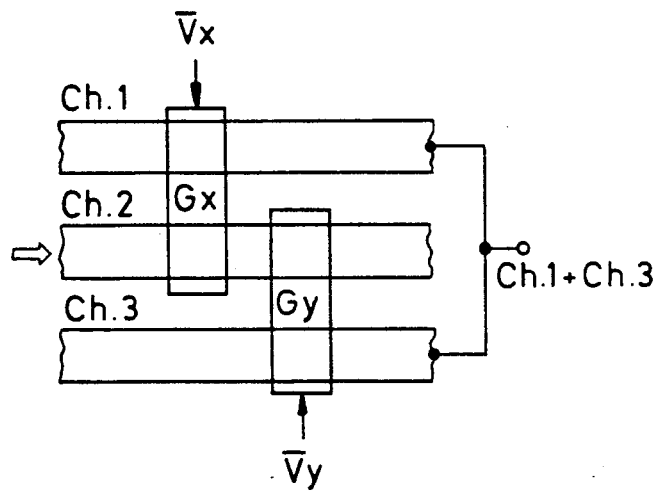

The invention will now be described in more detail with reference to the accompanying drawings in which:

FIG. 1 is a schematic plan view of an electron-wave coupled switching device in accordance with the present invention, FIG. 2 is a schematic cross-section through the device of FIG. 1 as seen on the plane II—II in FIG. 1, FIG. 3 is a further schematic cross-section through the device of FIG. 1 as seen in the plane III—III, FIG. 4 is a plan view similar to that of FIG. 1 but showing an alternative device in accordance with the present invention which exploits the Aharonov-Bohm effect, FIG. 5 is a plan view again similar to FIG. 1 but of an alternative device bases on silicon, FIG. 6 is a cross-sectional view of the device of FIG. 5 corresponding to the plane VI or VIa, FIG. 7 is a cross-sectional view of the device of FIG. 5 taken on the plane VII—VII, FIG. 8 is a plan view of a switching device similar to FIG. 1 but having three electron waveguides, FIG. 9 shows a plan view similar to FIG. 8 but having four electron waveguides and a slightly different layout, FIGS. 10A, 10B, 10C and 10D explain the use of a switching device in accordance with FIG. 1 but provided with a second gate electrode in order to realise an exclusive OR gate (EOR), FIG. 10E shows a logic table of the values of the outputs of the two electron waveguides or channels for four different permutations of the two gate voltages, FIG. 10F shows how the second waveguide has an output corresponding to the function of an exclusive OR gate, FIGS. 11A, 11B, 11C and 11D explain the use of a switching device in accordance with FIG. 8 to realise both an AND gate and an inverter, FIG. 11E shows that the third electron waveguide of the FIG. 11A to 11D arrangement has an output corresponding to an AND gate and that the first electron waveguide has an output which corresponds to an inverter, FIG. 12A shows how the device of FIG. 8 can be used to realise a NOR gate, FIG. 12B shows how the second electron waveguide of the embodiment of FIG. 12A has an output corresponding to a NOR gate, FIG. 13A shows how the device of FIG. 8 can be used to realise an inverter, FIG. 13B shows how the third electron waveguide of the device of FIG. 13A has an output corresponding to an inverter, FIG. 14A shows how the same device of FIG. 8 can be modified to form an OR gate, and FIG. 14B shows how the combined outputs of the first and third electron waveguides of the device of FIG. 14A realise the function of an OR gate.

Turning firstly to the FIGS. 1, 2 and 3 there can be seen a semiconductor switching device based on III-V semiconductor materials, which in this particular embodiment comprise GaAs/AlGaAs.

The layerwise build up of the device is most readily apparent from the cross-sections of FIGS. 2 and 3.

As can be seen the device 10 comprises a substrate 12 of non-doped semi-insulating gallium arsenide which is typically about 300μ thick. This dimension is not critical. Although non-doped material is used, it is generally found that such semi-insulating substrates, even when very carefully prepared, are still slightly p-doped but this is not of any great importance. Grown on top of the gallium arsenide substrate 12 is a first semiconductor layer 14 which again consists of intrinsic gallium arsenide which is undoped but in practice tends to be slightly p-doped. The growth technique chosen is preferably molecular beam epitaxy however other epitaxial growth methods can also be used. The gallium arsenide layer 14 is typically at least 1μ thick and preferably 10μ thick. In practice the semiconducting layer 14 is not grown directly onto the substrate 12, but rather intermediate buffer layers 13 are provided which are intended to prevent any impurity present in the substrate entering into the highly pure gallium arsenide layer which is subsequently grown on top of the buffer layers 13. This technique is well known per se. The growth of a relatively thick layer 14 of GaAs by an epitaxial technique ensures that the layer has a high quality crystallographic structure.

On top of the GaAs layer 14 there is then grown a second layer 16 of $Al_{0.3}Ga_{0.7}As$ which is typically of 100 to 1000 Å thickness and is undoped apart from a narrow layer 18 which is subjected to modulation doping and in this case is n-doped with silicon at a concentration of 1 to $3 \times 10^{18}/cm^3$.

The dimensions used in the specific embodiment are in fact a thickness of 1000 Å for the total second layer 16 with the spacer material 17 between the doped layer 18 and the layer 14 having a thickness of 200 Å. The doped layer 18 itself also has a thickness of a further 200 Å and the thickness of the layer 16 above the layer 18 is then 600 Å. The layer 18 can however also be a single doped atomic plane. Its function is to provide electrons to the potential well which is created at the interface between the second layer 16 and the first layer 14 due to the different band gaps of the two different materials and these electrons are concentrated in the energetic potential well in the form of a two-dimensional electron gas.

On top of the gallium arsenide layer 16 there is then grown a gallium arsenide cap layer 20 which is of non-doped material and typically has a thickness of 100 to 300 Å. After this the device is subjected to photoetching to etch away the regions 22, 24 and 26 leaving the cap regions 28 and 30. Normally the level of the etched surface between the waveguides will be the same at all points to the side of and between the cap regions. However, in an alternative illustrated by dotted lines in FIG. 2 the side regions 22 and 26 are etched deeper than the region 24 immediately beneath the gate electrode in order to damp the effect of the later ion beam irradiation in the region of the chip beneath the gate electrode.

Having created the semiconductor device in this way four contacts E1 to E4 are then formed by diffusing gold or germanium into the semiconductor at a temperature of 450° C. The diffusion process is typically carried for 80 sec. and an atmosphere of 80% $N_2$ and 20% $H_2$ at normal pressure. These diffusion parameters are sufficient to ensure that the contact metals diffuse down into the boundary region between the layers 16 and 14 and make correct contact with the ends of the electron waveguides 34 and 36.

A gate electrode, for example in the form of a thin layer of gold is then deposited over the etched cap region and has the shape in cross-section which can be seen from FIG. 3 and the shape in plan view which can be seen from FIG. 1.

Following this the semiconductor device is subjected to ion beam bombardment using a wide area flux and this results in all areas of the substrate to the side of and between the cap regions 28 and 30 but not beneath the gate electrode 32 being made electrically insulating. The region of the device beneath the cap regions and beneath the gate electrode at the level of the electron waveguides is unaffected by the ion beam because of the increased material thickness and because of the metallic nature of the gate electrode which forms a barrier for the ions. The ion beam thus defines two channels 34 and 36 at the boundary between the second layer 16 and the semiconducting layer 14 with these channels functioning as electron waveguides. The shape of these channels 34 and 36 in plan view, as seen in FIG. 1, is determined by the shape given to the cap regions 28 and 30, i.e. in plan view the cap regions 28 and 30 have the same shape and size as the channels 34 and 36. It is the increased thickness of the material above the channels and also the metallic contact 32 which prevents the regions under these cap regions and under the gate electrode 32 from being converted to insulating material. The electron waveguides 34 and 36 are thus of a very shallow extent in the vertical direction in FIG. 2 or FIG. 3 and have a width and a separation from each other which is determined precisely by the position of the GaAs cap regions. In this example the cap regions have a width in the range 2 to $3 \times 10^3$ Å and are spaced apart from one another by the same distance. The cap regions also have a further benefit in as much as they protect the underlying AlGaAs.

The operation of this semiconductor switching device will now be described in more detail with reference to the underlying physics.

The device as shown can be considered as having two end regions ($z<0$ and $z>L$) without coupling between the electron waveguides (EWGs) and a central region ($0<z<L$) consisting of a coupling region of the EWGs shown in FIG. 1. As previously described the structure has four electrodes E1-E4. The coupling strength in the central region can be controlled by the gate voltage.

In the end regions, the quasi one dimensional electron gases are formed under the GaAs cap quantum wires (see the papers by J. S. Weiner, G. Danan, A. Pinczuk, J. Valladares, L. N. Pfeiffer, and K. West, Phys. Rev. Lett. 63, 1641 (1989); T. L. Cheeks, M. L. Roukes, A. Scherer, and H. G. Graighead, Appl. Phys. Lett. 53, 1964 (1988)). In order to obtain the coupling between EWGs in the central region, the gate voltage is controlled so that the electron wave functions of the two EWGs overlap each other in the channel plane (see the papers by M. Okada, T. Oshima, M. Matsuda, N. Yokoyama, and A. Shibatomi, Jpn. J. Appl. Phys. 27, L2424 (1988)).

According to Yariv, C. Lindsey, and U. Sivan, J. Appl. Phys. 58, 366 (1985) one can express an eigenstate $\psi(x)$ of an electron in the coupled EWG potential $V(x)$ as a linear combination of the wave function $\psi_{1,2}(x)$ of the two isolated EWGs, i.e., $$\psi(x) = a\psi_1(x) + b\psi_2(x) \tag{1}$$

where the Schrödinger equations obeyed by $\psi_{1,2}(x)$ are the single-EWG equations $$H_{1,2}\psi_{1,2} = E_{1,2}\psi_{1,2}, \tag{2}$$

$$H_{1,2} = \frac{\hbar}{2m^*} \cdot \frac{\partial^2}{\partial x^2} + V_{1,2}, \tag{3}$$

where $m^*$ is the carrier effective mass and $V_{1,2}$ the potential energy functions of the isolated EWGs.

It is now appropriate to consider the time evolution of the electron wave function after an electron is initially launched in one of the two EWGs. The time evolution of the wave function is treated by the time dependent Schrödinger equation, $$i\hbar \frac{\partial \chi}{\partial t} = H\psi \tag{4}$$

where $$H = \frac{\hbar^2}{2m^*} \cdot \frac{\partial^2}{\partial x^2} + V_1(x) + V_2(x) - V_0, \tag{5}$$

and $V_O$ is the potential barrier height between the two EWGs. Substituting Eq. (1) into Eq. (4) and using Eqs. (2) and (3), one obtains the coupled equations for the linear combination amplitudes a and b of Eq. (1):

$$i\hbar \frac{da}{dt} = aE_1 + a<1|V_2 - V_0|1> + b<1|V_1 - V_0|2> \quad (6a)$$

$$i\hbar \frac{db}{dt} = bE_2 + a<2|V_2 - V_0|1> + b<2|V_1 - V_0|2> \quad (6b)$$

The explicit determination of the matrix elements involved in Eq. (6) has been carried out by using the normalized single EWG solutions $\psi_1(x)$ and $\psi_2(x)$ by Yariv et al. The elements $<1|V_1-V_0|2>$ and $<2|V_2-V_0|1>$ have a factor of the form $\exp(-Kd)$, and the elements $<1|V_2-V_0|1>$ and $<2|V_1-V_0|2>$ have a factor of the form $\exp(-2Kd)$, where K is a constant depending on the structure of the coupled EWGs and d the barrier width between the two EWGs. Consequently, one can neglect the elements of $<1|V_1-V_0|1>$ and $<2|V_1-V_0|2>$ and obtain the simple coupled equation between a and b of Eq. (1) in the simple form:

$$\frac{da}{dt} = -i\omega_1 a - ic_1 b, \quad (7a)$$

$$\frac{db}{dt} = -i\omega_2 b - ic_2 b, \quad (7b)$$

where $$\omega_1 = E_1/\hbar, \; \omega_2 = E_2/\hbar, \; c_1 = \quad (8)$$
$$<1|V_1 - V_0|2>/\hbar, c_2 = <2|V_2 - V_0|1>/\hbar.$$

This coupled equation has the same form as that for the coupled mode equation appearing in the coupling of optical modes in space (for example see N. Bloembergen, Nonlinear Optics (Benjamin, New York, 1965)) and for the Schrödinger equation for the two-level atomic system interacting with the electromagnetic (laser) field in time (for example see L. Allen and J. H. Eberly, Optical Resonance and Two-Level Atoms (Wiley, New York, 1975)).

The determinantal equation for an assumed $\exp(-i\omega t)$ dependence is, $$(\omega - \omega_1)(\omega - \omega_2) - c_1 c_2 = 0, \quad (9)$$

with the solution $$\omega_\pm = \frac{\omega_1 + \omega_2}{2} \pm \omega_0, \quad (10)$$

where $$\omega_0 = \sqrt{\left(\frac{\omega_1 - \omega_2}{2}\right)^2 + c_1 c_2}. \quad (11)$$

In the coupling (central region, therefore, the two modes $\psi_1$ and $\psi_2$ of the coupled EWGs form two new modes which oscillate independently from each other, one with $\omega_+$ and the other with $\omega_-$. The difference $\Delta\omega = \omega_+ - \omega_-$ causes the phase difference between the symmetric and antisymmetric state leading to the creative or destructive interference of the wave functions in each EWG. The general solution of Eq. (7) is a combination of these two modes. Suppose that the electron waves in each EWG are given as $a = a(0)$ and $b = b(0)$ at $t = 0$. For these conditions the solutions are as follows:

$$a(t) = \left[a(0)\left(\cos\omega_0 t + i\frac{\omega_2 - \omega_1}{2\omega_0}\sin\omega_0 t\right) - i\frac{c_1}{\omega_0}b(0)\sin\omega_0 t\right]e^{-i(\omega_1+\omega_2)t/2} \quad (12a)$$

$$b(t) = \left[-i\frac{c_2}{\omega_0}a(0)\sin\omega_0 t + b(0)\left(\cos\omega_0 t + i\frac{\omega_1 - \omega_2}{2\omega_0}\sin\omega_0 t\right)\right]e^{-i(\omega_1+\omega_2)t/2} \quad (12b)$$

For the symmetric EWG case, i.e., $\omega_1 = \omega_2$ and $c_1 = c_2 = c$ and for the initial condition of $a(0) = 1$ and $b(0) = 0$, Eq. (12) becomes very simple and the probabilities of finding the electron in each EWG are given by $$|a(t)^2| = \cos^2 ct \quad (13a)$$

$$|b(t)^2| = \sin^2 ct \quad (13b)$$

These equations mean that an electron, initially in one of the two coupled EWGs, is transferred to the other one at times $t = (n+\frac{1}{2})\pi/c$ (n=0,1,2, ...). At time $t = n\pi/c$ the electron transfers completely back to the initially injected EWG. It should be noticed that in order to get complete electron transfer, the subband energy levels ($E_1$ and $E_2$) of the isolated EWGs should therefore have the same value. If $E_1 \neq E_2$ complete transfer is not obtained but instead partial transfer is realized.

Next it is appropriate to consider how to initially excite only one EWG and the coupling length needed for the electron transfer. It is assumed that in the isolated EWG only the lowest subband is occupied and the electron transport in the coupled region (0<x<L) is ballistic, i.e. there is no elastic or inelastic scattering. It is also assumed that the applied potentials $eV_{12} = \mu_1 - \mu_2$ and $eV_{14} \approx \mu_1 - \mu_4$ are not far from the Fermi energy, i.e., $eV_{12}, eV_{14} << E_F$, where $\mu_i$ (i=1~4) is the chemical potential of the i-th electrode (M. Büttiker, Phys. Rev. Lett. 57, 1761 (1986)).

The case will first be considered in which there is no coupling between the two EWGs in the central region. In this case, the electron injected from the electrode E1 propagates from port A to port B. All electrons injected from the electrode E1 can therefore reach the electrode E2. Next, if there is any coupling between the two EWGs in the central region, the electron injected from the port A feels the existence of the other guide at the moment that the electron reaches z=0, that is, the coupling between the EWGs begins at z=0. This situation corresponds to the fact that an electron is initially injected in one of the two EWGs. The wave function for the injected electron is therefore a linear combination of the symmetric and antisymmetric-state of the coupled EWGs. As discussed above, the resultant linear combination wave function corresponds to an electron oscillating back and forth between the two EWGs with a frequency $f = \Delta E/h$. The electron injected at z=0 will be found in the other well after one-half period of this oscillation, that is, after the time $t_T = h/2\Delta E$.

Since it was assumed that the applied potentials are not so far from the Fermi energies, the transport is mainly due to electrons at the Fermi energies $E_F$ (see the papers by R. J. Haug, A. H. MacDonald, P. Streda, and K. von Klitzing, Phys. Rev. Lett. 61, 2797 (1988) and M. Büttiker, Phys. Rev. Lett. 57, 1761 (1986)). The velocity of electrons injected in the coupling region is therefore given by the Fermi velocity $v_F$. Therefore, after travelling the distance $l_c = v_F t_T$, the electron injected from the port A will be found in the other EWG. The coupling energy $\Delta E$ for the symmetric EWG has been evaluated by Krömer and Okamoto (H. Krömer and H. Okamoto, Jpn. J. Appl. Phys. 23, 970 (1984) and Yariv et al. Krömer and Okamoto have shown that the coupling energy $\Delta E = 10$ meV is roughly the upper limit of the desirable inter-well coupling energies for GaAs/AlGaAs quantum well structures. Although the separation between the EWGs is relatively large for the planar device structure proposed in this paper, large coupling energies can be expected in spite of the large separation of the EWGs, because the electrons are weakly confined by the gate voltage in the coupling region. Actually Lorke et al., (A. Lorke, J. P. Kotthaus, and K. Ploog, to be published) have reported on the electrostatic generation of quantum dots that the coupling strength between dots can be tuned by the applied gate voltage and observed the coupling strength of $1 \sim 2$ meV. Such coupling strengths can also be expected in the present device structure for the separation of the EWGs of $d = 0.2 \sim 0.3$ μm.

For the electron density of $n = 10^{11}$ cm$^{-2}$, one obtains the Fermi velocity $v_F = 1.4 \cdot 10^7$ cm$^3$/sec by using the relation between the Fermi velocity and the carrier density:

$$v_F = \sqrt{\frac{2E_F}{m^*}} = \frac{h}{m^*} \cdot \sqrt{\frac{n_s}{2\pi}} \qquad (14)$$

By assuming the coupling energy $\Delta E = 1$ meV, one finds a transfer time ($t_T$) of 2 psec and a coupling length $l_c = v_F t_T = 0.28$ μm.

The RC time constant for the gate is estimated from the experimental results on the modulation-doped field-effect transistor (MODFET) (J. T. Drummond, W. T. Masselnik, and H. Morkoc, Proc. of IEEE 74, 773 (1986)) to be much smaller than 0.1 psec, because the dimension of the gate for the proposed device is very small (typically 1 μm × 0.3 μm).

In EWGs of finite cross-section one has to consider both the motion of carriers transverse to the EWG and the motion along the EWG (see for example the paper by M. Büttiker, Phys. Rev. B 38, 9375 (1988) and the paper by C. S. Chu and R. S. Sorbello, Phys. Rev. B 40, 5941 (1989)). Motion in the transverse direction is quantized by a set of discrete energies $E_n$. To this energy must be added the kinetic energy for motion along the direction of the EWG, $\hbar^2 k^2 / 2m^*$, such that $E_F = \hbar^2 k_n^2 / 2m^* + E_n$. Consequently, if many transverse modes are present, the transfer ratio is degraded because the coupling lengths for different modes are slightly different from each other.

It should be mentioned that the structure of the device shown in FIG. 1 is reminiscent of the optical directional coupler in which optical waveguides interact with one another by the way of their evanescent fields. The mechanism of operation of such optical couplers is however completely different from the mechanism underlying the present proposal. The interaction leads to power transfer from one waveguide to the other waveguide.

A modification of the device of the present invention is shown in FIG. 4 which again shows a gallium arsenide/aluminium gallium arsenide structure having the same basic layer sequences and dimensions as shown in FIGS. 2 and 3. However in the present case the first contact means on the one side of the gate region comprises a common contact E1 to both the first and second waveguides 34 and 36. This device comprises a new class of electron-wave coupled device and is based to some degree on the optical device analogy. The device shown is in fact a device where the Aharonov-Bohm (AB) effect (see the papers by S. Datta, M. R. Melloch, S. Bandyopadhyay, R. Noren, M. Vaziri, M. Miller, and R. Reinfenberger, Phys. Rev. Lett. 55, 2344 (1985); S. Datta, M. R. Melloch, S. Bandyopadhyay, and M. S. Lundstrom, Appl. Phys. Lett. 48, 487 (1986) is combined with the coupled EWG structure. In this device, the electrons are injected from both input ports A and C and these ports are subject to a perpendicular magnetic field B. therefore, the electrons travelling in the ports A and C experience the phase difference induced by the AB effect. When the phase difference $\phi$ between ports A and C becomes $2n \pm \pi/2 (n = 0, 1, 2, \ldots)$, all electrons injected from the input ports A and C are conducted to the output ports B or D. This can be derived from the initial conditions with $a(0) = 1$ and $b(0) = \exp(i\phi)$ (see N. Tsukada, R. Tsujinishi, and K. Tomishima, J. Appl. Phys. 50, 4611 (1979); 51, 2450 (1980)). Both the switching time and the coupling length for this device are halved compared to those of the device shown in FIG. 1.

The device proposed herein is however not restricted to III-V semiconductor materials. It can for example also be realized on the basis of silicon.

As can be seen from FIG. 5 the basic layout of the device is very similar to that of the device of FIG. 1 however the gate region 32 is formed here as three distinct gates, i.e. a first gate 40 and second gate 42 and a third gate 44.

The semiconductor device itself comprises a p-doped silicon chip 46 onto which there is deposited an insulating SiO$_2$ layer 48 and subsequently metallic cap regions 50, 52. A further layer of silicon dioxide 54 is then deposited over the silicon dioxide layer 48 and over the cap regions 50 and 52 and finally the gate electrodes are then deposited over the overlying silicon dioxide layer 54. The cap regions 50 and 52, which again have the same shape as the electron wave guides 34 and 36 are formed here of aluminium or gold. The gate electrodes 40, 42 and 44 are also formed of aluminium or gold. As with the previous embodiments the cap regions 50 and 52 can be formed by deposition of a complete layer of the relevant material followed by subsequent etching.

In this structure the metallic cap regions 50 and 52 form electron waveguide electrodes which are positively biased. These metallic cap regions extend close up to the respective contacts E1 to E4 but do not actually contact the latter, i.e. are spaced from the contacts E1 to E4 by a small distance as illustrated by the broken lines representing the ends of the cap regions. The inversion layer formed by the positively biased electron waveguide electrodes 50 and 52 is confined by the gate electrodes 40, 42 and 44. In the uncoupled regions under the gate electrodes 40 and 44 the confined gate voltage (illustrated schematically at 58 in FIG. 6) is sufficiently high to separately confine the electron waves at $\psi_a$ and ψb. In the coupled region beneath the central, second gate electrode 42 the gate voltage is varied to induce the coupling between the electron waves ψa and ψb. This is illustrated schematically in FIG. 7 by the variable voltage supply 56 which is set to a potential lower than the potential 58 applied in FIG. 6 to provide confinement of the electron waves. In practice the length of the gate 42 is also $l_c$ as in the previously described gallium arsenide device. The separations of the gate electrode should be short, typically less than about 0.1 μm.

As previously mentioned the material used is p-type silicon and the first $SiO_2$ layer is formed on the substrate by thermal oxidation. After forming the electron waveguide electrodes 50 and 52 (again by photolithography, i.e. deposition of a full metallic layer and etching); the second $SiO_2$ layer 54 is formed on the structure by CVD oxidation prior to forming of the gate electrodes in the usual manner.

FIGS. 8 and 9 shows examples of how switching devices in accordance with the present invention can be connected together, for example to form integrated circuits.

In the switching device of FIG. 8 three electron waveguides 34, 36 and 60 are provided and there are three input ports E1, E3 and E5 and three output ports E2, E4 and E6. A first gate electrode 32 is used to control the switching from the input port E3 to the input port E1 and vice versa so that the structure defined by E1, E3, E2, E4, 34, 36 and 32 corresponds closely to the embodiment of FIG. 1, which is why the same reference numerals and letters have been used. So far as the third waveguide 60 is concerned it and the electron waveguide 34 are coupled via the gate region 62, so that the input ports E3, E5, the outputs E4, E6, the two electron waveguides 34 and 60 and the gate region 62 form a second structure which is substantially equivalent to that of FIG. 1. By applying suitable signals to the gate electrodes 32 and 62 a signal applied to the port E1 could for example be transferred first to the electron waveguide 34 and then subsequently to the electron waveguide 60 so that it could be extracted at the port E6. A signal applied to port E5 could be switched to port E4 and a signal applied to E3 could be switched to the port E2. In the same way a signal applied to the port E1 could be switched to the output port E4. Of course the situation can also be arranged, by control of the applied gate voltages, such that signal applied to the input ports E1, E3 or E5 are switched directly along the associated waveguides to the corresponding output ports E2, E4 or E6.

A further development of this arrangement is shown in FIG. 9. Here it will be seen that the ports E1, E3, E5, E2, E4, E6, the electron waveguides 34, 36 and 60 and the gate electrode 32 and 62 correspond in function to the circuit shown in FIG. 8, the positions of the electrodes and waveguides have simply been modified to indicate that different geometries are possible. In addition the device of FIG. 9 has been supplemented by a further waveguide 70 a further inlet port E7 and a further outlet port E8, with a further gate region 72 being provided for switching between the waveguides 60 and 70. Thus in this way the signal applied to port E7 could for example be directed to either of ports E4 or E6 (by the application of suitable gate potentials), or could be directed straight through to the port E8. Equally the signal applied to port E5 could, if desired, be directed to port E8 by applying a suitable potential to the gate 72.

The description of FIGS. 8 and 9 indicate that switching devices of the present invention can readily be connected in series and in parallel.

Finally, it will be appreciated that although the present invention has been described with reference to devices where the majority carriers are electrons, inverse devices are also possible where the majority carriers are holes and the claims will also be understood to extend to such inverse devices. In this case references to electron wavefunctions and electron waveguides will be understood to refer to hole wave and hole waveguides and p-doping will be substituted for n-doping. Otherwise the devices remain basically the same.

The concept of the invention is also extremely well suited to realising logic gates.

To simplify the discussion the most fundamental case will be considered in which the coupling coefficient C ($\bar{V}g$) which can be coupled by the gate voltage $\bar{V}g$ and the gate length Lg satisfy the condition that:

$$C(\bar{V}g) Lg = \pi:2$$

We call this condition the "ON" state.

In this condition, an electron injected into the first channel of the device of FIG. 1, i.e. into the electron waveguide 36 is completely transferred into the second channel or electron waveguide 34. If, on the other hand, there is no coupling between the channels, i.e. $C(\bar{V}g)=0$, then an electron injected into the first channel is conducted in the first channel as it is.

FIG. 10 shows how the switching device of FIG. 1 can be modified by the addition of a second gate electrode to realise the function of an exclusive OR gate.

For the sake of convenience FIGS. 10A to 10D only show the central portion of FIG. 1 with the two electron waveguides 34 and 36 and with two grid electrodes which have been designated here Gx and Gy.

If the two gates Gx and Gy are off, as shown in FIG. 10A, represented by the statement $\bar{V}g(OFF)$ against Gx and Gy, then a signal or electron injected into channel 1 (electron waveguide 36), as signified by the arrow 1 at the left hand side of FIG. 10A, will emerge at the output of channel 1 as signified at the right hand side of FIG. 10A. No signal or electron in injected into channel 2 so that no signal or electron appears at the output thereof.

If now the gate y is turned on, then the signal or electron injected into channel 1 will appear at the output of channel 2, as illustrated in FIG. 10B. Similarly, if gate y is left turned off but gate x is turned on, the electron or signal applied to the input of channel 1 will appear at the output of channel 2, as shown in FIG. 10C. In both FIGS. 10B and 10C no signal is present at the output of channel 1.

If in contrast, both gates x and y are turned on, as shown in FIG. 10D then the electrode or signal applied at the input to channel 1 first moves into channel 2 at the influence of gate x but then moves back to channel 1 under the influence of gate 2. Thus it appears at the output of channel 1 as shown in FIG. 10D. Since no signal is applied at the input of channel 2 there is no signal at the output of that channel.

The resulting outputs of the channels 1 and 2 are summarized in FIG. 10E for the four different possible permutations of the ON and OFF states of the gates x and y.

If we now rewrite the table of FIG. 10E setting the state $\bar{V}g$ (OFF) equal to the binary value 0 and $\bar{V}g$ (ON)

equal to the binary value 1 then we obtain the table of FIG. 10F. From this we can see that binary signals ($\overline{V}x$ and $\overline{V}y$) applied to the gates x and y result in binary signals at the output of channel 2 which correspond to a combination of the signals applied to the two gates x and y in accordance with the logic of an exclusive OR gate. To make the gate work it is of course necessary to apply the signals 1 and 0 to the channels 1 and 2 respectively which is however not regarded as a serious disadvantage, and is more than compensated for by the device's clear advantages in terms of switching speed, size and simplicity. Moreover, there is an inherent decoupling between the binary signals applied to the gates and the signals at the outputs which can be of benefit under some circumstances.

The embodiment of FIG. 11 shows a development of this basic concept based on the precise structure of the switching device of FIG. 8.

Here the three electron waveguides 34, 36 and 60 are labelled channels 1, 2 and 3 respectively and the gates 32 and 62 are labelled gates x and y (or Gx and Gy). Using the same considerations as were explained in detail in relation to FIG. 10 and AND signal can be obtained at the channel 3 output of the switching device of FIG. 8 (in relation to the signals applied to the two gates) if the signal 1 is applied to the channel 1 input and if the signal 0 (no signal) is applied to each of the channel 2 and 3 inputs.

This is to say the binary signals to be combined in accordance with the function of an AND gate are applied to the two gates x and y. The resulting logic output of channels 1, 2 and 3 is shown in table 11E. Here it will be seen that the output of channel 1 corresponds to an inverted value of the signal applied to the gate x whereas the output of channel 3 corresponds to a combination of the two binary signals applied to the gates x and y in accordance with the function of an AND gate.

The structure of FIG. 8 is particularly interesting since it can also be used in different manners to realise further gates. Thus, FIG. 12A shows the use of the same structure to realise a NOR gate. In this case the signal 1 is applied to the input of channel 2 whereas the signal 0 (no signal) is applied to the inputs of channels 1 and 3. The two signals to be combined are again applied to the gate electrodes Gx and Gy. The truth table shows that the signals applied to the gate electrodes Gx and Gy result in an output from the channel 2 which corresponds to the combination of the two binary signals in accordance with a NOR gate.

The same structure is used in accordance with FIG. 13A to realise a NOT gate, i.e. an inversion of the binary signal applied to the gate Gy. In order to achieve this function the signal 0 has to be applied to the inputs of the two channels 1 and 2 whereas the signal 1 has to be applied to the input of channel 3.

In addition, FIG. 14A shows a variation of the FIG. 12A arrangement by which an OR gate can be realised. The arrangement of the switching device of FIG. 14A is physically the same as that of the device of FIG. 8 except that the outputs of the two channels 1 and 3 (i.e. the outputs E2 and E6 are connected together at a common terminal (labelled here Ch1+Ch3). In correspondence with FIG. 12A the signal O (no signal) is applied to the inputs of channels 1 and 3 whereas a signal 1 is applied to the input of channel 2. The output of channel 2 is of course then the same NOR signal as is achieved in the FIG. 12A arrangement, however the result of adding the outputs of channels 1 and 3 is to obtain an OR function at the common output terminal, that is to say the logic signals applied to the gates Gx and Gy result in an output as if the signals had been combined in a normal OR gate in accordance with an OR gate function.

Whereas the gates of the logic devices have been described with reference to the structures of FIGS. 1 and 8 it will be understood that the gates could also be realised using a magnetic field and a narrower gate as disclosed in FIG. 4.

More complicated logic functions can also be realised in the above described manner.

The structure of FIG. 8 has the fundamental advantage that one device can be used to realise a whole variety of logic functions depending simply on the voltage applied to the inputs of the channels and to the two gates (and whether or not channel outputs are combined, e.g. as in FIG. 14A).

Moreover, the logic circuits described herein can be combined together to build large scale integrated logic circuits.

We claim:

1. An electron-wave coupled semiconductor device, in particular a semiconductor switching device, comprising a first layer of semiconductor material having a first bandgap, a second layer of semiconductor material formed on said first semiconductor layer and having a second bandgap greater than the first said bandgap, first and second electron waveguides formed alongside but spaced apart from each other in the first semiconductor layer adjacent the boundary between said first layer and said second layer, a gate region extending over said second layer transverse to and over said electron waveguides, first contact means providing input connections to said first and second electron waveguides on one side of said gate region and further contact means providing separate output connections from said first and second electron waveguides on the opposite side of the gate region from said first contact means, wherein the dimension of the electron waveguides under said gate region, both along and transverse to said electron waveguides and also the dimension between said electron waveguides is smaller than the elastic means free path for electrons at the operating temperature of the device.

2. A device in accordance with claim 1 wherein said electron waveguides are channels formed by constricted regions of a two-dimensional electron gas, said restricted regions representing a quasi one-dimensional electron gas.

3. A device in accordance with claim 1 wherein said first and second electron waveguides each have sub-band energy levels and wherein said sub-band energy levels of each of said first and second electron waveguides have the same value.

4. A device in accordance with claim 1, characterized by means for varying the voltage applied in operation to said gate region.

5. A device in accordance with claim 1, characterized in that said first contact means comprises separate first and second contacts to said first and second electron waveguides.

6. A device in accordance with claim 1, characterized in that said first contact means comprises a common contact to said first and second electron waveguides; and in that field generating means is provided for generating a magnetic field perpendicular to a plane containing said first and second waveguides in the region between said common contact and said gate region.

7. A device in accordance with claim 1 and based on a III-V heterostructure.

8. A device in accordance with claim 7 wherein one of a two dimensional electron gas and a quasi one-dimensional electron gas forming said electron waveguides is formed in said first semiconductor layer adjacent said second layer by modulation doping of said second layer.

9. A device in accordance with claim 7 and based on an AlGaAs/GaAs heterostructure, characterized in that said first semiconducting layer comprises an intrinsic gallium arsenide layer having a thickness in the range $1\mu$ to $10\mu$, in particular $2\mu$, grown on a GaAs substrate, with buffer layers therebetween, in that said second layer comprises an undoped $Al_{0.3}Ga_{0.7}As$ layer having a thickness in the range from 100 to 1000 Å and typically 200 Å; and in that a modulation doping layer in the form of n-doped $Al_{0.3}GA_{0.7}As$ is provided in said second layer, the dopant being typically silicon with a concentration in the range 1 to $3\times10^{18}/cm^3$, wherein said modulation doping layer typically has a thickness from one monolayer up to ca. 500 Å and is spaced from the boundary of said GaAs layer by a distance in the range from 10 to 300 Å.

10. A device in accordance with claim 1, characterized in that regions bounding said electron waveguides at sides thereof and between said electron waveguides are converted to insulating material by ion implantation.

11. A device in accordance with claim 10, characterized in that cap regions having substantially the same shape and size in plan view as said electron waveguides are formed over said second layer.

12. A device in accordance with claim 11, characterized in that said gate electrode is formed over said second layer and over said cap regions.

13. A device in accordance with claim 11, characterized in that said gate region is a Schottky gate, for example of gold.

14. A device in accordance with claim 1 wherein said first contact means and said further contact means comprise metallic contacts, diffused into said device, at substantially 450° C. for a period of 80 sec. in a gaseous environment of 80% $N_2$ and 20% $H_2$ at normal pressure.

15. A device in accordance with claim 1, wherein said electron waveguides have a thickness in the range up to 30 Å, a width in the range 2 to $3\times10^3$ Å and are separated from each other by a distance of 2 to $3\times10^3$ Å.

16. A device in accordance with claim 1, wherein said gate region has a width in the length direction of said electron waveguides of the order of magnitude of $0.3\mu$ and a length transverse to the electron waveguides of the order of magnitude of $1\mu$.

17. A device in accordance with claim 1, wherein said semiconducting material is based on silicon and said first layer comprises a p-doped silicon layer and said second layer comprises an $SiO_2$ layer with said electron waveguides being formed by a two-dimensional electron gas in said p-doped silicon layer adjacent the boundary between said p-doped silicon layer and said $SiO_2$ layer, wherein said gate region comprises first, second and third gate electrodes, and wherein, in operation, the voltages applied to the first and second gate electrodes are selected to separately confine the electron-waves and the voltage applied to the second gate electrode, which is disposed between the first and third gate electrodes, is varied to induce coupling between the electron-waves.

18. A device in accordance with claim 17, wherein the width of the second gate electrode in the length direction of the electron waveguides corresponds to the coupling length $l_c$; and wherein the separation between the first and second gate electrodes and between the second and third gate electrodes is relatively short, for example, less than 0.1 $\mu$m.

19. A device in accordance with claim 17 wherein metallic cap regions are formed on said $SiO_2$ layer, on the application of a potential to induce electrons into the region beneath the cap regions to form said electron waveguides, there being a further $SiO_2$ layer grown on top of exposed portions of the first said $SiO_2$ layer and said cap regions and said gate electrodes being applied on top of the overlying $SiO_2$ layer.

20. A device in accordance with claim 1, wherein a plurality of electron waveguides are provided and are arranged parallel to one another and spaced apart in the first semiconducting layer adjacent the boundary with said spacer layer and wherein a plurality of gate regions are provided, each gate region extending over two adjacent electron waveguides.

21. A device according to claim 1 but provided as an inverse structure where the majority carriers are holes.

22. Use of the semiconductor device of claim 1 with an additional gate region extending over said second layer transverse to and over said electron waveguides and spaced apart from the other gate region, whereby to realise a structure capable of operating as an exclusive OR gate.

23. A device in accordance with claim 20 comprising first, second and third electron waveguides and first and second gate regions with said first gate region extending over said first and second waveguides and said second gate region extending over said second and third electron waveguides.

24. A device in accordance with claim 22 wherein a first signal is applied to an input of said first electron waveguide and no signal is applied to an input of said second electron waveguide; wherein further signals to be combined in accordance with an exclusive OR-function are applied to said gate region and to said additional gate region; and wherein an output signal is obtained from an output of said first electron waveguide.

25. A device in accordance with claim 23 when used to realise the function of at least one of an AND-gate, a NOR-gate, a NOT-gate and an OR-gate.

26. A device in accordance with claim 23 wherein a first signal is applied to an input of said first electron waveguide and no signal is applied to inputs of said second and third electron waveguides, wherein further signals to be combined in accordance with an AND-gate function are applied to said first and second gate regions and wherein an output signal is obtained from an output of said third electron waveguide.

27. A device in accordance with claim 23 wherein a first signal is applied to an input of said second electron waveguide and no signal is applied to inputs of said first and third electron waveguides, wherein further signals to be combined in accordance with a NOR-gate function are applied to said first and second gate regions and wherein an output signal is obtained from an output of said second electron waveguide.

28. A device in accordance with claim 23 wherein a first signal is applied to an input of said third electron waveguide and no signal is applied to inputs of said first and second electron waveguides, wherein further signals to be combined in accordance with an NOT-gate function are applied to said first and second gate regions and wherein an output signal is obtained from an output of said third electron waveguide.

29. A device in accordance with claim 23 wherein a first signal is applied to an input of said second electron waveguide and no signal is applied to inputs of said first and third electron waveguides, wherein further signals to be combined in accordance with an OR-gate function are applied to said first and second gate regions and wherein an output signal is obtained by adding outputs of said first and third electron waveguides.

* * * * *